United States Patent
Barbieri et al.

(10) Patent No.: US 9,093,962 B2
(45) Date of Patent: Jul. 28, 2015

(54) TWO-STAGE OPERATIONAL AMPLIFIER IN CLASS AB

(71) Applicant: ST-Ericsson SA, Plan-les-Ouates (CH)

(72) Inventors: Andrea Barbieri, Lodi (IT); Germano Nicollini, Piacenza (IT)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/402,003

(22) PCT Filed: May 24, 2013

(86) PCT No.: PCT/EP2013/060794
§ 371 (c)(1),
(2) Date: Nov. 18, 2014

(87) PCT Pub. No.: WO2013/175004
PCT Pub. Date: Nov. 28, 2013

(65) Prior Publication Data
US 2015/0155841 A1    Jun. 4, 2015

Related U.S. Application Data

(60) Provisional application No. 61/653,128, filed on May 30, 2012.

(30) Foreign Application Priority Data

May 24, 2012  (EP) ..................................... 12169324

(51) Int. Cl.
*H03F 3/45* (2006.01)
*H03F 3/21* (2006.01)
*H03M 1/18* (2006.01)

(52) U.S. Cl.
CPC .............. *H03F 3/45071* (2013.01); *H03F 3/21* (2013.01); *H03M 1/183* (2013.01); *H03F 2200/153* (2013.01); *H03F 2203/45192* (2013.01)

(58) Field of Classification Search
CPC .............. H03F 3/45183; H03F 3/3022; H03F 3/45071; H03F 3/21; H03F 2203/45192; H03F 2200/153; H03G 1/0023; H03M 1/183
USPC .......... 330/253–255, 257, 285; 341/135, 136, 341/155
See application file for complete search history.

(56) References Cited

U.S. PATENT DOCUMENTS 6,828,855 B1 * 12/2004 Wang ............................ 330/253
7,078,971 B2 * 7/2006 Colbeck ........................ 330/255

(Continued)

FOREIGN PATENT DOCUMENTS

WO    2009/063276 A1    5/2009

OTHER PUBLICATIONS

International Search Report issued in corresponding International application No. PCT/EP2013/060794, date of mailing Jul. 30, 2013.
Written Opinion of the International Searching Authority issued in corresponding International application No. PCT/EP2013/060794, date of mailing Jul. 30, 2013.

(Continued)

*Primary Examiner* — Khai M Nguyen
(74) *Attorney, Agent, or Firm* — Patent Portfolio Builders PLLC

(57) ABSTRACT

The invention relates to a two-stage operational amplifier (400) in class AB for driving a load ($R_{LB}$, $R_{LA}$) comprising: an input stage (401) comprising differential input terminals ($I_N$, $I_P$) and a first differential output terminal (O1P) and a second differential output terminal (O1N) for providing a first differential driving signal (Out1P) and a second differential driving signal (Out1N), respectively; an output stage (402) comprising a first output branch (403) having a first differential input terminal (I1P) operatively connected to the first differential output terminal (O1P) of the input stage (401) to receive the first differential driving signal (OUT1P) and a second output branch (404) having a second differential input terminal (I1N) operatively connected to the second differential output terminal (O1N) of the output stage (401) to receive the second differential driving signal (Out1N), —a control circuit (405) configured to control the output stage (402).

7 Claims, 5 Drawing Sheets

(56) References Cited

U.S. PATENT DOCUMENTS

| | | | |
|---|---|---|---|
| 7,176,760 B2 * | 2/2007 | Jones | 330/253 |
| 7,187,235 B2 * | 3/2007 | Moon | 330/255 |
| 7,551,030 B2 * | 6/2009 | An et al. | 330/255 |
| 7,557,658 B2 * | 7/2009 | Perez | 330/255 |
| 7,701,295 B2 * | 4/2010 | Bajdechi et al. | 330/298 |
| 7,855,600 B2 * | 12/2010 | An et al. | 330/255 |
| 7,859,338 B2 * | 12/2010 | Bajdechi et al. | 330/253 |
| 8,363,045 B2 * | 1/2013 | Shimatani | 345/211 |
| 8,536,947 B2 * | 9/2013 | Wang et al. | 330/255 |
| 2008/0290940 A1 | 11/2008 | Scuteri et al. | |

OTHER PUBLICATIONS

Extended European Search Report issued in corresponding European patent application No. EP 12 16 9324, date of completion of the search Oct. 10, 2012.

Lopez-Morillo, E., et al., "A Very Low-Power Class AB/AB Op-amp based Sigma-Delta Modulator for Biomedical Applications," 49th IEEE International Midwest Symposium on Circuits and Systems, 2006 (MWSCAS), Aug. 1, 2006, pp. 458-462, XP031113639, ISBN: 978-1-4244-0172-7.

Rabii, Shahriar, et al., "A 1.8-V Digital-Audio Sigma-Delta Modulator in 0.8-um CMOS," IEEE Journal of Solid-State Circuits, IEEE Service Center, Piscataway, NJ, USA, vol. 32, No. 6, Jun. 1, 1997, XP011060495, ISSN: 0018-9200, pp. 783-796.

* cited by examiner

TWO-STAGE OPERATIONAL AMPLIFIER IN CLASS AB

DESCRIPTION

1. Technical Field

The present invention relates to operational amplifiers, particularly the invention relates to a two-stage operational amplifier in class AB.

2. Background Art

One of the main aspects to take into account during the development of an electronic device, especially for a mobile device (e.g. a mobile phone), is the current consumption.

For example, in the mobile phones segment, the reduction of the current consumption is a key point in order to create mobile phones with much more functionalities without reducing the battery operating time.

In a mobile phone, fully differential analog circuits frequently use operational amplifiers and in some cases, especially when a high output current is needed, these amplifiers must be implemented with Class AB output stages.

Unfortunately, until now, there is no solution useful to obtain a two-stage full Class AB operational amplifier and therefore, depending on the requirements, such an amplifier must be replaced with a two stages Class A amplifier or a three stages Class AB amplifier. However, both the above mentioned solutions require a higher current consumption.

Each of the FIGS. 1, 2 and 3 shows an operational amplifier of the prior art than can be used for applications that need a high output current.

FIG. 1 shows a two-stage Class A operational amplifier 100 for driving a load $R_L$.

As it can be seen from the circuit diagram of FIG. 1, the load current $I_L$ can't exceed the output current $I_{OUT}$, fixed by the reference bias voltage $V_{BP}$. Therefore, the higher load current $I_L$ is, the higher is the current output $I_{OUT}$ and consequently higher is the current consumption of the operational amplifier 100.

FIG. 2 shows a three-stage operational amplifier 200 for driving a load $R_L$.

As known, a three-stage operational amplifier is inherently of the type in class AB. Therefore, the load current $I_L$ can be much higher than the output current $I_{OUT}$.

However, the main drawback of the operational amplifier of FIG. 2 with respect to a two stage operational amplifier (e.g. of the type shown in FIG. 1) is the Gain Bandwidth Product, GBWP.

Typically, considering the same current consumption, in a three-stage operational amplifier, the Gain Bandwidth Product is strongly lower than the Gain Bandwidth Product of a two-stage operational amplifier, as known by an expert in the field.

FIG. 3 shows a fully differential two-stage operational amplifier in class AB, known in literature.

The implementation in class AB is obtained decoupling the output signal OUT1 of the input stage of the operational amplifier from the signal OUT1_DEC, with a CR high-pass filter.

The operational amplifier of FIG. 3 is not a real operational amplifier in class AB because the class AB can be implemented only for signals having a frequency higher than $1/2\pi CR$.

In view of this, for applications in which signals with frequency lower than 100 Hz must be processed, for instance in the audio field, the operational amplifier of FIG. 3 is not achievable since the CR high-pass filter should have, with the actual technology, a huge area occupation.

SUMMARY OF THE INVENTION

An object of the present invention is to provide a two-stage class AB operational amplifier which overcomes at least some of the drawbacks and limitations of the known prior art and particularly which allows to obtain a controlled output current over a wide frequency range.

A two-stage operational amplifier in class AB according to the invention for driving a load comprises: an input stage comprising differential input terminals and a first differential output terminal and a second differential output terminal for providing a first differential driving signal and a second differential driving signal, respectively; an output stage comprising a first output branch having a first differential input terminal operatively connected to the first differential output terminal of the input stage to receive the first differential driving signal and a second output branch having a second differential input terminal operatively connected to the second differential output terminal of the output stage to receive the second differential driving signal; a control circuit configured to control the output current on the first output branch and the second output branch of the output stage, the control circuit comprising a first PMOS transistor in a diode configuration and operatively connected in a current mirror configuration to a second PMOS transistor of the first output branch of the output stage, a first NMOS transistor connected in series with the first PMOS transistor and having a gate terminal connected to a bias voltage, a third PMOS transistor in a diode configuration and operatively connected in a current mirror configuration to a fourth PMOS transistor of the second output branch of the output stage, a second NMOS transistor connected in series with the third PMOS transistor and having a gate terminal connected to the bias voltage. The control circuit of the operational amplifier further comprises: a third NMOS transistor operatively connected in parallel with the first NMOS transistor and having a gate terminal arranged to receive the second differential driving signal, and a fourth NMOS transistor operatively connected in parallel with the second NMOS transistor and having a gate terminal arranged to receive the first differential driving signal.

A further embodiment of the invention is an Analog-to-Digital Converter comprising a two-stage operational amplifier in class AB in accordance with the invention.

A further embodiment of the invention is a portable equipment comprising such Analog-to-Digital Converter and a digital filter.

BRIEF DESCRIPTION OF THE DRAWINGS

The characteristics and the advantages of the present two-stage operational amplifier in class AB will be better understood from the following detailed description of one embodiment thereof, which is given by way of illustrative and non-limiting example with reference to the annexed drawings, in which.

DETAILED DESCRIPTION OF PREFERRED EMBODIMENTS

Circuit diagram of preferred embodiment of a two-stage operational amplifier in class AB of the invention for driving a load can be described with reference to FIG. 4.

Two stage operational amplifiers can be used in any applications in which there is a need of signal amplification, e.g. portable devices, MP3 players, cellular phones, PDAs (Personal Digital Assistant), portable computers, tablets, acoustic transducers, and so on.

An example of application of the operational amplifier according to the invention will be described later.

Furthermore, it should be observed that the load to be driven can be of at least a resistive type or of resistive and capacitive type. Typical values of such a load are lower than 100 KΩ.

Figure 1:
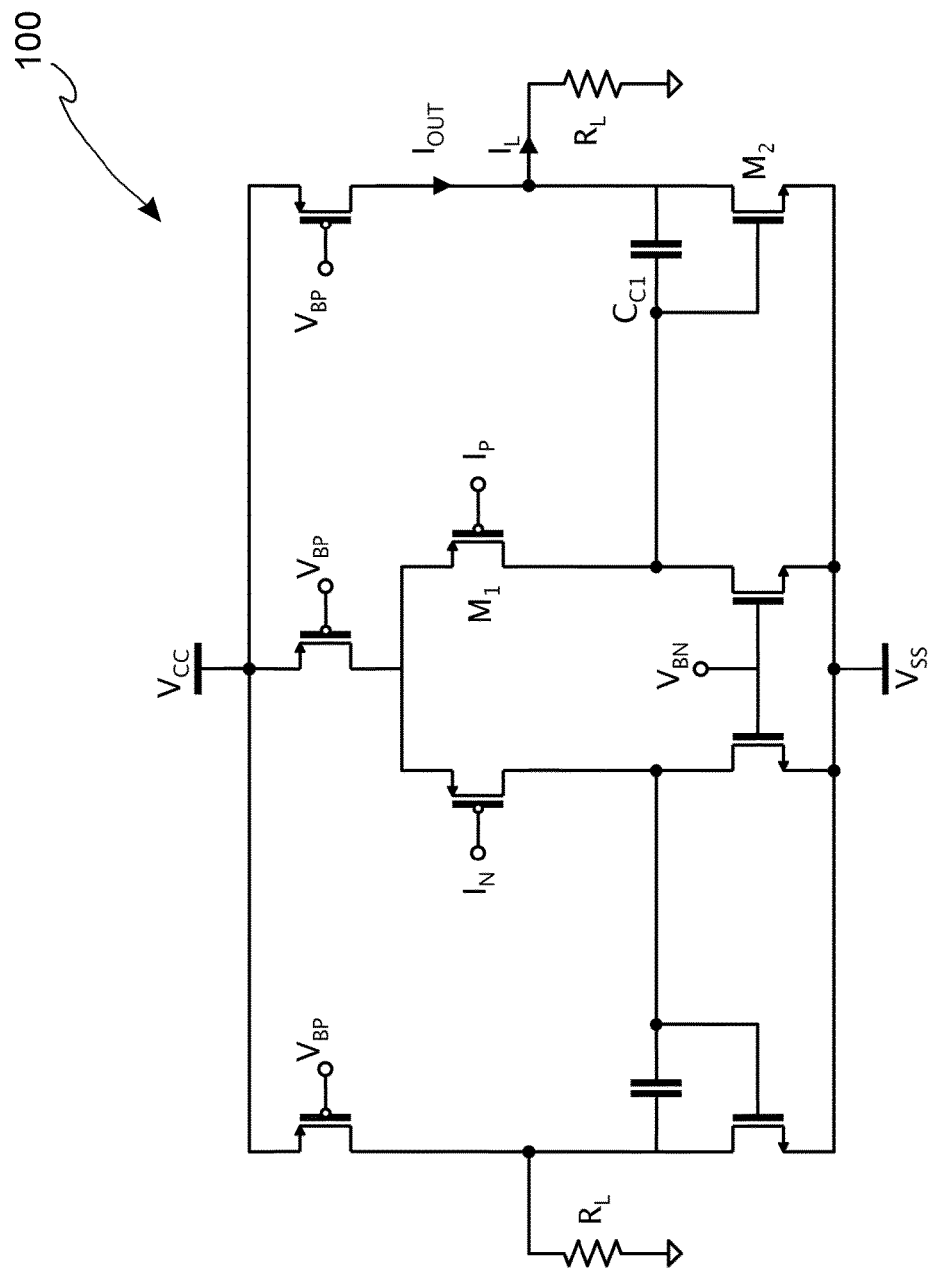
FIG. 1 shows a circuit diagram of a two-stage operational amplifier in class A of the prior art.
Figure 2:
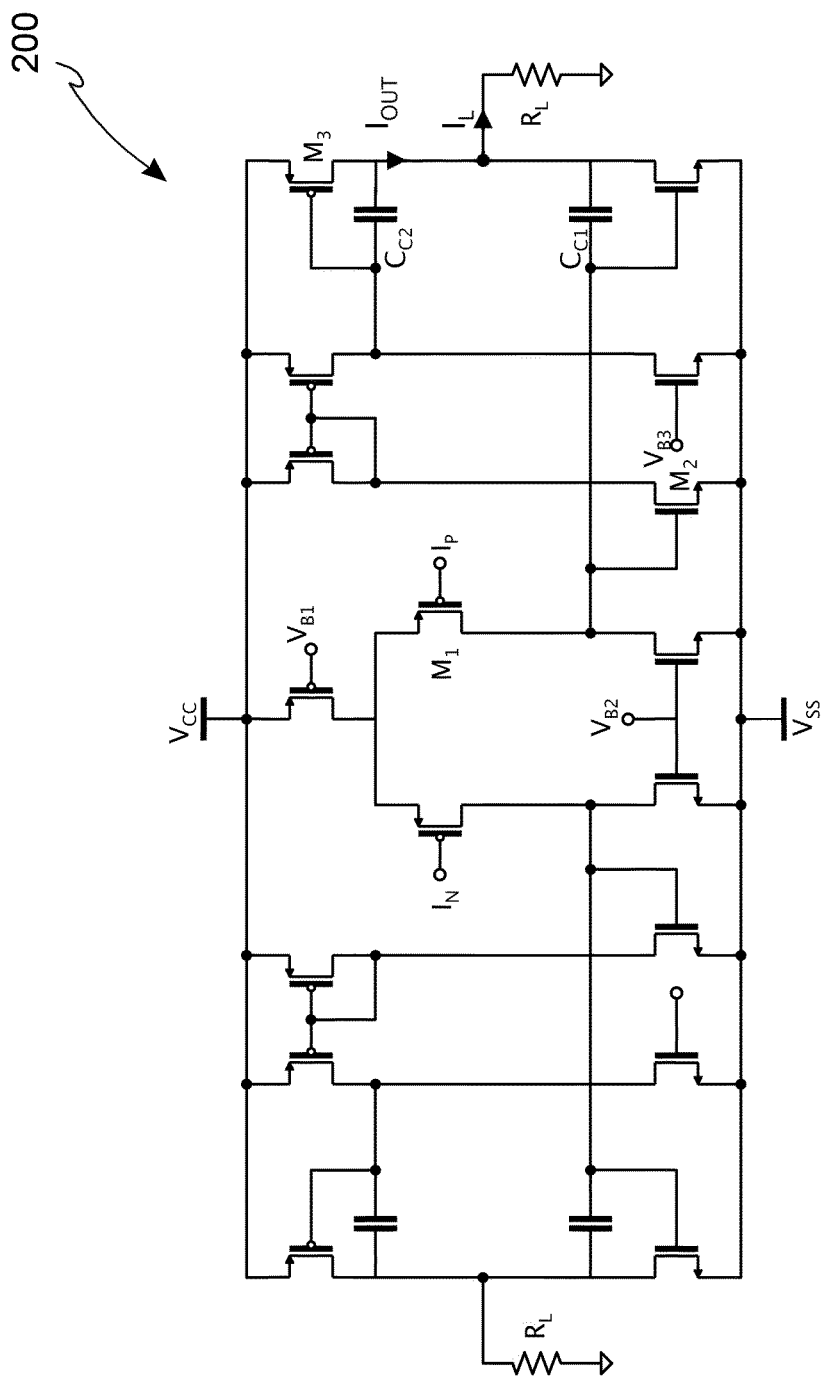
FIG. 2 shows a circuit diagram of a three-stage operational amplifier in class AB of the prior art.
Figure 3:
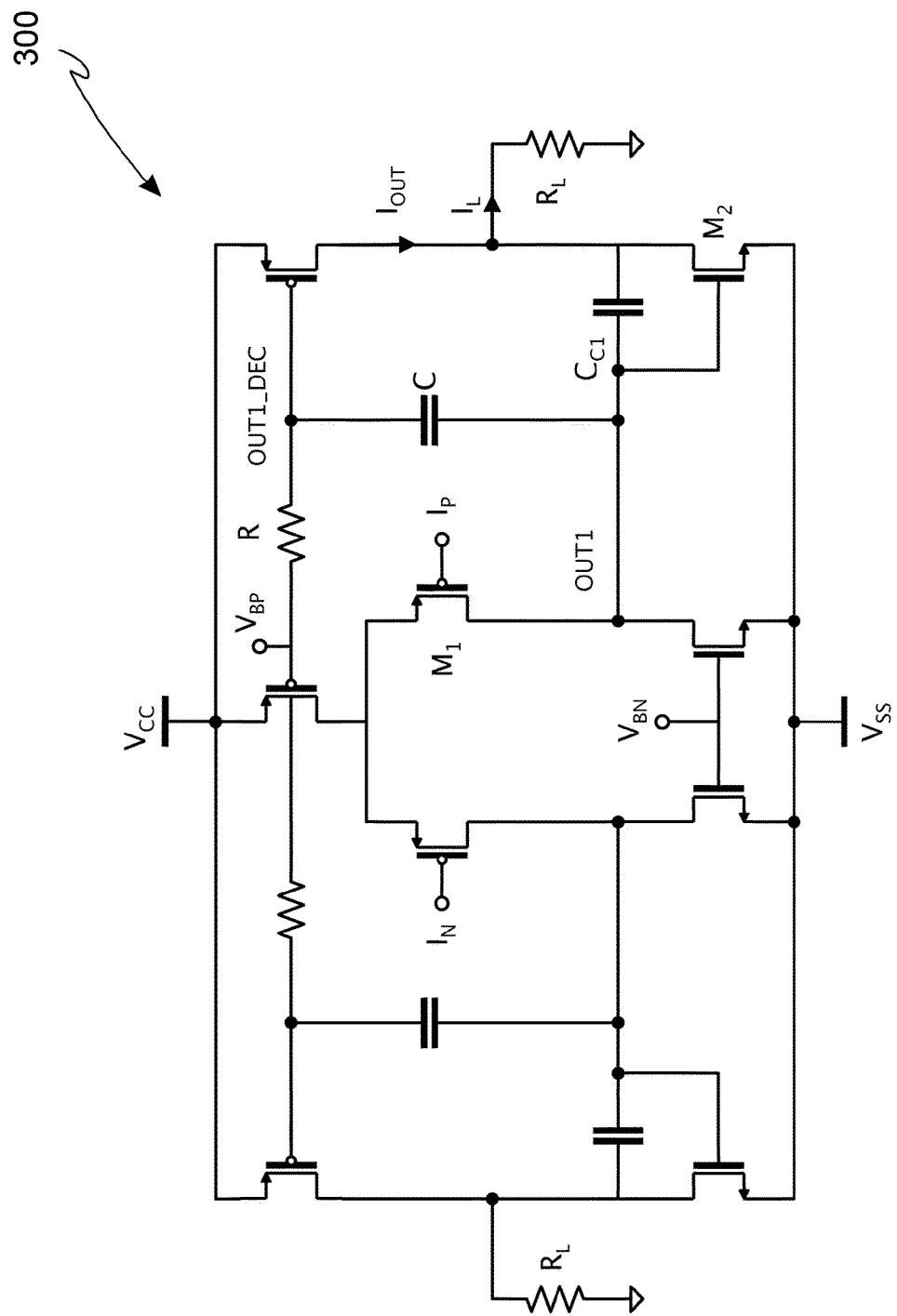
FIG. 3 shows a circuit diagram of a two-stage operational amplifier class AB of the prior art.
Figure 4:
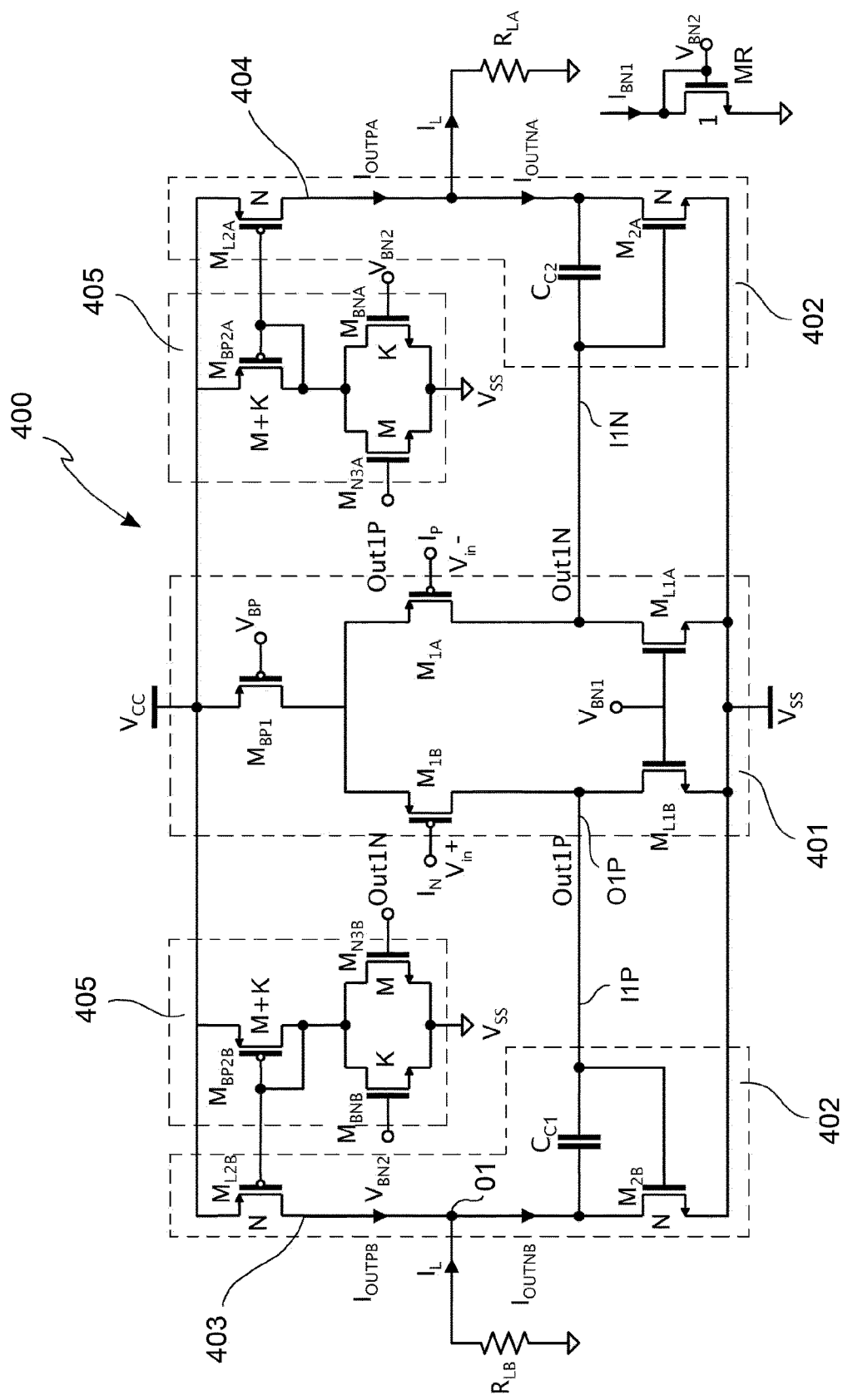
FIG. 4 shows a circuit diagram of a two-stage operational amplifier in class AB according to the invention.

With reference to FIG. 4, the two stage operational amplifier 400 in class AB (or simply operational amplifier 400) of the invention for driving a load can be now described.

The operational amplifier 400 comprises an input stage 401 comprising a first differential input terminal $I_N$ and a second differential input terminal $I_P$ to receive differential input signals $V_{in}^+$, $V_{in}^-$, respectively, and a first differential output terminal O1P and a second differential output terminal O1N for providing a first differential driving signal Out1P and a second differential driving signal Out1N, respectively.

The input stage 401 is operatively connected between a first reference potential $V_{CC}$, for example the power supply, and a second reference potential $V_{SS}$, for example the ground. The value of the power supply depends on the application of the operational amplifier. Since the operational amplifier 400 of the embodiment of FIG. 4 does not comprise MOS transistors in cascode configuration, it can operate even with very low voltage power supply. Examples of possible values of the power supply are in the range 1.2 V-3.3 V.

In greater detail, the input stage 401 comprises a first differential input PMOS transistor $M_{1B}$ having the gate terminal corresponding to the first input terminal $I_N$ of the input stage 401, the source terminal operatively connected to the first reference voltage $V_{CC}$ through a first current generator $M_{BP1}$ and the drain terminal operatively connected to the second reference voltage $V_{SS}$ through a first active load $M_{L1B}$. The drain terminal of the first differential input PMOS transistor $M_{1B}$ corresponds to the first differential output terminal O1P of the input stage 401.

In addition, the input stage 401 comprises a second differential input PMOS transistor $M_{1A}$ having the gate terminal corresponding to the second input terminal $I_P$ of the input stage 401, the source terminal operatively connected to the first reference voltage Vcc through the first current generator $M_{BP1}$ and the drain terminal operatively connected to the second reference voltage $V_{SS}$ through a second active load $M_{L1A}$. The drain terminal of the second differential input PMOS transistor $M_{1A}$ corresponds to the second differential output terminal O1N of the input stage 401.

The first current generator $M_{BP1}$ is for example a further PMOS transistor having the source terminal connected to the first reference voltage $V_{CC}$, the drain terminal connected to the source terminal of both the first differential input PMOS transistor $M_{1B}$ and the second differential input PMOS transistor $M_{1A}$, the gate terminal connected to a first bias voltage $V_{BP}$. The value of the first bias voltage $V_{BP}$ is about $V_{CC}$-$V_{TH(MPB1)}$ wherein $V_{TH(MPB1)}$ is the threshold voltage of the PMOS transistor $M_{BP1}$ corresponding to the first current generator.

The first active load $M_{L1B}$ is for example a NMOS transistor having the drain terminal connected to the drain terminal of the first differential input PMOS transistor $M_{1B}$, the source terminal connected to the second reference voltage $V_{SS}$ and the gate terminal connected a second bias voltage $V_{BN1}$. The value of the second bias voltage $V_{BN1}$ is about $V_{TH(ML1B)}$, i.e. the threshold voltage of the NMOS transistor $M_{L1B}$ corresponding to the first active load.

The second active load $M_{L1A}$ is for example a NMOS transistor having the drain terminal connected to the drain terminal of the second differential input PMOS transistor $M_{1A}$, the source terminal connected to the second reference voltage Vss and the gate terminal connected the second bias voltage $V_{BN1}$.

With reference in general to the amplifier 400 of the FIG. 4, it further comprises an output stage 402 comprising a first output branch 403 having a first differential input terminal I1P operatively connected to the first differential output terminal O1P of the input stage 401 to receive the first differential driving signal OUT1P and a second output branch 404 having a second differential input terminal I1N operatively connected to the second differential output terminal O1N of the input stage 401 to receive the second differential driving signal Out1N.

The output stage 402 of the amplifier 400 will be described in greater detail in the following of the present description.

Turning to the amplifier 400 of the FIG. 4, it further comprises a control circuit 405 configured to control a first output current $I_{OUTPB}$ on the first output branch 403 of the output stage 402 and a second output current $I_{OUTPA}$ on the second output branch 404 of the output stage 402.

In greater detail, the control circuit 405 comprising a first PMOS transistor $M_{BP2B}$ in a diode configuration and operatively connected in a current mirror configuration to a second PMOS transistor $M_{L2B}$ of the first output branch 403 of the output stage 402.

In addition, the control circuit 405 further comprises a first NMOS transistor $M_{BNB}$ connected in series with the first PMOS transistor $M_{BP2B}$ and having the gate terminal connected to a third bias voltage $V_{BN2}$. The value of the third bias voltage $V_{BN2}$ is about the threshold voltage of the first PMOS transistor $M_{BP2B}$.

Furthermore, the control circuit 405 comprises a third PMOS transistor $M_{BP2A}$ in a diode configuration and operatively connected in a current mirror configuration to a fourth PMOS transistor $M_{L2A}$ of the second output branch 404 of the output stage 402.

In addition, the control circuit 405 comprises a second NMOS transistor $M_{BNA}$ connected in series with the third PMOS transistor $M_{BP2A}$ and having the gate terminal connected to the third bias voltage $V_{BN2}$.

With reference to the embodiment of the FIG. 4, the control circuit 405 advantageously further comprises a third NMOS transistor $M_{N3B}$ operatively connected in parallel with the first NMOS transistor $M_{BNB}$ and having the gate terminal arranged to receive the second differential driving signal Out1N, as provided by the input stage 401.

Furthermore, the control circuit 405 comprises a fourth NMOS transistor $M_{N3A}$ operatively connected in parallel with the second NMOS transistor $M_{BNA}$ and having the gate terminal arranged to receive the first differential driving signal Out1P, as provided by the input stage 401.

In greater detail, the first PMOS transistor $M_{BP2B}$ of the control circuit 405 has the source terminal connected to the first reference voltage $V_{CC}$ and the drain terminal connected to both the drain terminal of the first NMOS transistor $M_{BNB}$ of the control circuit 405 and the drain terminal of the third NMOS transistor $M_{N3B}$ of the control circuit 405. In order to assume the diode configuration, the drain terminal and the gate terminal of the first PMOS transistor $M_{BP2B}$ are connected one another. Both the first NMOS transistor $M_{BNB}$ and the third NMOS transistor $M_{N3B}$ of the control circuit 405 have the source terminal connected to the second reference voltage $V_{SS}$.

Furthermore, the second PMOS transistor $M_{BP2A}$ of the control circuit 405 has the source terminal connected to the first reference voltage $V_{CC}$ and the drain terminal connected to both the drain terminal of the second NMOS transistor $M_{BNA}$ and the drain terminal of the fourth NMOS transistor $M_{N3A}$. In order to assume the diode configuration, the drain terminal and the gate terminal of the second PMOS transistor $M_{BP2A}$ are connected one another. Both the second NMOS transistor $M_{BNA}$ and the fourth NMOS transistor $M_{N3A}$ have the source terminal connected to the second reference voltage $V_{SS}$.

With reference in greater detail to the output stage 402 of the amplifier 400, the first output branch 403 comprising the second PMOS transistor $M_{L2B}$ and a fifth NMOS transistor $M_{2B}$ connected in series one another between the first reference voltage $V_{CC}$ and the second reference voltage $V_{SS}$. The second PMOS transistor $M_{L2B}$ of the first output branch 403 is connected in a current mirror configuration with the first PMOS transistor $M_{BP2B}$ of the control circuit 405.

In particular, the second PMOS transistor $M_{L2B}$ has the source terminal connected to the first reference voltage $V_{CC}$, the gate terminal connected to the gate terminal of the first PMOS transistor $M_{BP2B}$ of the control circuit 405 and the drain terminal connected to the drain terminal of the fifth NMOS transistor $M_{2B}$ to define a first differential output node O1 operatively connected to a first load $R_{LB}$.

The first load $R_{LB}$ is for example of a resistive type and it has a first value comprises in the range of values previously described (<100 KΩ).

The fifth NMOS transistor $M_{2B}$ has the source terminal connected to the second reference voltage $V_{SS}$ and the gate terminal connected to the first output differential terminal O1P of the input stage 401 of the amplifier 400. The gate terminal of the fifth NMOS transistor $M_{2B}$ is connected to the drain terminal of the fifth NMOS transistor $M_{2B}$ through a first capacitor $C_{C1}$. The first capacitor $C_{C1}$ advantageously allows stabilizing the amplifier 400 by means of the Miller effect (as known by a skilled person in the field).

The value of the first capacitor $C_{C1}$ depends on the properties of the amplifier 400, e.g. the bandwidth and the current consumption. Examples of such value are in the range from few hundreds of fF to few tens of pF.

With reference to the second output branch 404 of the output stage 402, it comprises the fourth PMOS transistor $M_{L2A}$ and a sixth NMOS transistor $M_{2A}$ connected in series one another between the first reference voltage $V_{CC}$ and the second reference voltage $V_{SS}$. The fourth PMOS transistor $M_{L2A}$ of the first output branch 404 is connected in a current mirror configuration with the third PMOS transistor $M_{BP2A}$ of the control circuit 405.

In particular, the fourth PMOS transistor $M_{L2A}$ has the source terminal connected to the first reference voltage $V_{CC}$, the gate terminal connected to the gate terminal of the third PMOS transistor $M_{BP2A}$ of the control circuit 405 and the drain terminal connected to the drain terminal of the sixth NMOS transistor $M_{2A}$ to define a second differential output node O2 operatively connected to a second load $R_{LA}$.

The second load $R_{LA}$ is for example of a resistive type and it has a second value comprises in the range of values previously described (<100KΩ). The second value of the second load $R_{LA}$ is equal to the first value of the first load $R_{LB}$.

According to another embodiment (not shown in the figures), the operational amplifier can comprise only one load, e.g. of a resistive type, electrically connected between the first differential output node O1 and the second differential output node O2.

The sixth NMOS transistor $M_{2A}$ has the source terminal connected to the second reference voltage $V_{SS}$ and the gate terminal connected to the second output differential terminal O1N of the input stage 401 of the amplifier 400. The gate terminal of the sixth NMOS transistor $M_{2A}$ is connected to the drain terminal of the sixth NMOS transistor $M_{2A}$ through a second capacitor $C_{C2}$.

The second capacitor $C_{C2}$ has the same function of the first capacitor $C_{C1}$, previously described. In the embodiment of the FIG. 4, the second capacitor $C_{C2}$ has the same value of the first capacitor $C_{C1}$.

Taking the above considerations into account, the behavior of the operational amplifier of the present invention is described below, with reference to the embodiment of FIG. 4. It should be noted that the operational amplifier 400 is arranged to drive a load of at least a resistive type or of resistive and capacitive type.

The circuitry portion of the amplifier 400 performing the class AB function corresponds to the control circuit 405, previously described.

It should be noted that in FIG. 4 the references K, M and N, alone or a combination, associated with each of the PMOS or NMOS transistor of the amplifier 400, are examples of multiplying factors for the PMOS or NMOS transistors with corresponding relative size ratios (W(width)/L(length)) with respect to a size ratio W/L of a reference NMOS transistor MR representing a reference current mirror driven by a current $I_{BN1}$.

As an example, in the case the reference NMOS transistor MR has the size ratio W/L=10 μ/1 μm and the fourth NMOS transistor $M_{N3A}$ has size ratio W/L=40 μm/1 μm, the multiplying factor M of the fourth NMOS transistor $M_{N3A}$ is equal to four.

The reference NMOS transistor MR is part of the amplifier 400 and it can be considered as connected to all the NMOS transistors of the circuit diagram having the gate terminal connected to the third bias voltage $V_{BN2}$. However, in order to simplify the figure, the reference NMOS transistor MR is schematically illustrated in FIG. 4 on the right side of the circuit diagram of the amplifier 400.

The reference NMOS transistor MR can be connected with both the first NMOS transistor $M_{BNB}$ and the second NMOS transistor $M_{BNA}$ in a current mirror configuration. In that case, the reference NMOS transistor MR has the drain terminal connected to a current reference provided by a central bias block external to the circuit diagram of the amplifier 400, the source terminal connected to the second reference voltage $V_{SS}$ and the gate terminal connected to the third bias voltage $V_{BN2}$.

On the basis of the multiplying factor previously defined, the following relationships can be written, wherein each label $I(M_x)$ indicating the current driven by the transistor named $M_x$:

$$I(M_{BNB}) = I_{BN1} \cdot K$$

$$I(M_{BNA}) = I_{BN1} \cdot K$$

$$I(M_{N3B}) = I_{OUTNA} \cdot (M/N)$$

$$I(M_{N3A}) = I_{OUTNB} \cdot (M/N)$$

$I(M_{L2A})=I_{OUTPA}=I(M_{BP2A})\cdot N/(M+K)$ $I(M_{L2B})=I_{OUTPB}=I(M_{BP2B})\cdot N/(M+K)$ $I_{OUTPA}=(I(M_{N3A})+I(M_{BNA}))\cdot N/(M+K)=((I_{OUTNB}\cdot(M/N)+(I_{BN1}\cdot K))\cdot N/(M+K)=I_{OUTNB}\cdot M/(M+K)+I_{BN1}\cdot N\cdot K/(M+K)$ $I_{OUTPB}=(I(M_{N3B})+I(M_{BNB}))\cdot N/(M+K)=((I_{OUTNA}\cdot(M/N)+(I_{BN1}\cdot K))\cdot N/(M+K)=I_{OUTNA}\cdot M/(M+K)+I_{BN1}\cdot N\cdot K/(M+K)$ In the case the load current $I_L$ on both the first load $R_{LB}$ and the second load $R_{LA}$ is equal to zero, the first output current $I_{OUTPB}$ on the first output branch 403 is equal to the current $I_{OUTNB}$ passing to the fifth NMOS transistor $M_{2B}$: $I_{OUTPB}=I_{OUTNB}=I_{OUT}$ (idle output current of the amplifier 400).

In a corresponding way, the second output current $I_{OUTPA}$ on the second output branch 404 is equal to the current $I_{OUTNA}$ passing to the sixth NMOS transistor $M_{2B}$: $I_{OUTPA}=I_{OUTNA}=I_{OUT}$.

Therefore, the following relationships can be obtained:

$$I_{OUT} = \left[I_{OUT}\cdot\left(\frac{M}{N}\right) + K\cdot I_{BN1}\right]\cdot\frac{N}{M+K}$$

$$I_{OUT} - \frac{M}{M+K}I_{OUT} = I_{BN1}\cdot\frac{K\cdot N}{M+K}$$

$$I_{OUT} = I_{BN1}\cdot N$$

Therefore, it is demonstrated that the idle output current $I_{OUT}$ is known and it can be controlled.

In the case the load current $I_L$ on both the first load $R_{LB}$ and the second load $R_{LA}$ is different to zero, the following relationships can be considered:

$$\begin{cases} I_{OUTPB} + I_L = I_{OUTNB} \\ I_{OUTPA} - I_L = I_{OUTNA} \\ I_{OUTPB} = \frac{K}{M+K}N\cdot I_{BN1} + \frac{M}{M+K}I_{OUTNA} \\ I_{OUTPA} = \frac{K}{M+K}N\cdot I_{BN1} + \frac{M}{M+K}I_{OUTNB} \end{cases} \Rightarrow$$

$$\begin{cases} I_{OUTNB} - I_L = \frac{M}{M+K}N\cdot I_{BN1} + \frac{M}{M+K}I_{OUTNA} \\ I_{OUTNA} + I_L = \frac{K}{M+K}N\cdot I_{BN1} + \frac{M}{M+K}I_{OUTNB} \end{cases}$$

$$\begin{cases} I_{OUTNB} = \frac{K}{M+K}N\cdot I_{BN1} + \frac{M}{M+K}I_{OUTNA} + I_L \\ I_{OUTNA} = \frac{K}{M+K}N\cdot I_{BN1} + \frac{M}{M+K}I_{OUTNB} - I_L \end{cases}$$

$$I_{OUTNB} = \frac{K}{M+K}N\cdot I_{BN1} +$$

$$\frac{M}{M+K}\left[\frac{K}{M+K}N\cdot I_{BN1} + \frac{M}{M+K}I_{OUTNB} - I_L\right] + I_L$$

$$I_{OUTNB} = \frac{K}{M+K}N\cdot I_{BN1} + \frac{M\cdot K}{(M+K)^2}N\cdot I_{BN1} + \frac{M^2}{(M+K)^2}I_{OUTNB} - \frac{M}{M+K}I_L + I_L$$

$$I_{OUTNB}\left(1 - \frac{M^2}{(M+K)^2}\right) = \frac{2MK+K^2}{(M+K)^2}N\cdot I_{BN1} + \frac{K}{M+K}I_L$$

$$I_{OUTNB}\frac{K^2+2M\cdot K}{(M+K)^2} = \frac{2M\cdot K+K^2}{(M+K)^2}N\cdot I_{BN1} + \frac{K}{M+K}I_L$$

$$\begin{bmatrix} I_{OUTNB} = N\cdot I_{BN1} + \frac{M+K}{2M+K}I_L \\ I_{OUTNA} = N\cdot I_{BN1} - \frac{M+K}{2M+K}I_L \\ I_{OUTPB} = N\cdot I_{BN1} - \frac{M}{2M+K}I_L \\ I_{OUTPA} = N\cdot I_{BN1} + \frac{M}{2M+K}I_L \end{bmatrix}$$

Imposing the condition that all the currents have to be greater than zero, it can be obtained as follows:

$$N\cdot I_{BN1} - \frac{M+K}{2M+K}I_L > 0 \Rightarrow N\cdot I_{BN1} > \frac{M+K}{2M+K}I_L$$

Since $N\cdot I_{BN1}=I_{OUT}$, it can be obtained:

$$I_L < \frac{2M+K}{M+K}I_{OUT}$$

It should be noted that the choice to use the multiplying factor M, N and K and any combination of them as indicated in the embodiment of the FIG. 4 advantageously allows implementing simplified mathematical relationships and guarantees at the same time the balancing of the overall current.

In fact, the M/K ratio is the one responsible for the efficiency of the idle output current $I_{OUT}$ while the K/(M+K) ratio determines the value of the idle output current $I_{OUT}$.

From the previous relationship it is clear that, if the M/K ratio is sufficiently high (e.g. more than 5), the load current $I_L$ could be almost two times the idle output current $I_{OUT}$.

In any case, there are not preferable value for the M/K ratio. In the case of a value of the M/K ratio equal to 1, the solution of the invention is advantageous because the load current $I_L$ could be one time and half the idle output current $I_{OUT}$. Obviously, the higher M/K ratio is and the closest to the limit of $I_L$ as two times the idle output current $I_{OUT}$ can be obtained.

In view of this, even though the load current $I_L$ cannot be as high as in an ideal class AB amplifier, the proposed solution advantageously allows to provide a load current $I_L$ which can be double with respect to the idle output current $I_{OUT}$ of the operational amplifier over all the unity gain bandwidth of the operational amplifier by adding a simple control circuit comprising a reduced number of PMOS and NMOS transistors.

According to the present invention, other multiplying factors and any combination of them can be used, provided that the overall current balancing is satisfied.

In fact, considering the general case in which a reference K is associated to the transistors MBNA and MBNB (as in the embodiment of FIG. 4), a reference M is associated to the transistors MN3A and MN3B (as in the embodiment of FIG. 4), a reference j is associated to the transistors MBP2A and MBP2B (instead of reference M+K indicated in the embodiment of FIG. 4), a reference $N_P$ is associated to the transistors ML2A and ML2B (instead of reference N indicated in the embodiment of FIG. 4), a reference $N_n$ is associated to the transistors M2A and M2B (instead of reference N indicated in the embodiment of FIG. 4), indicating multiplying factors as previously defined, the M/K ratio is the one responsible for the efficiency of the idle output current $I_{OUT}$ while the multiplying factors j, Nn and Np should be chosen both to obtain and to guarantee the balancing of the overall current and to determine the idle output current $I_{OUT}$.

In such case, as well as in other cases using other multiplying factors, a different system of equations can be written.

Figure 5:
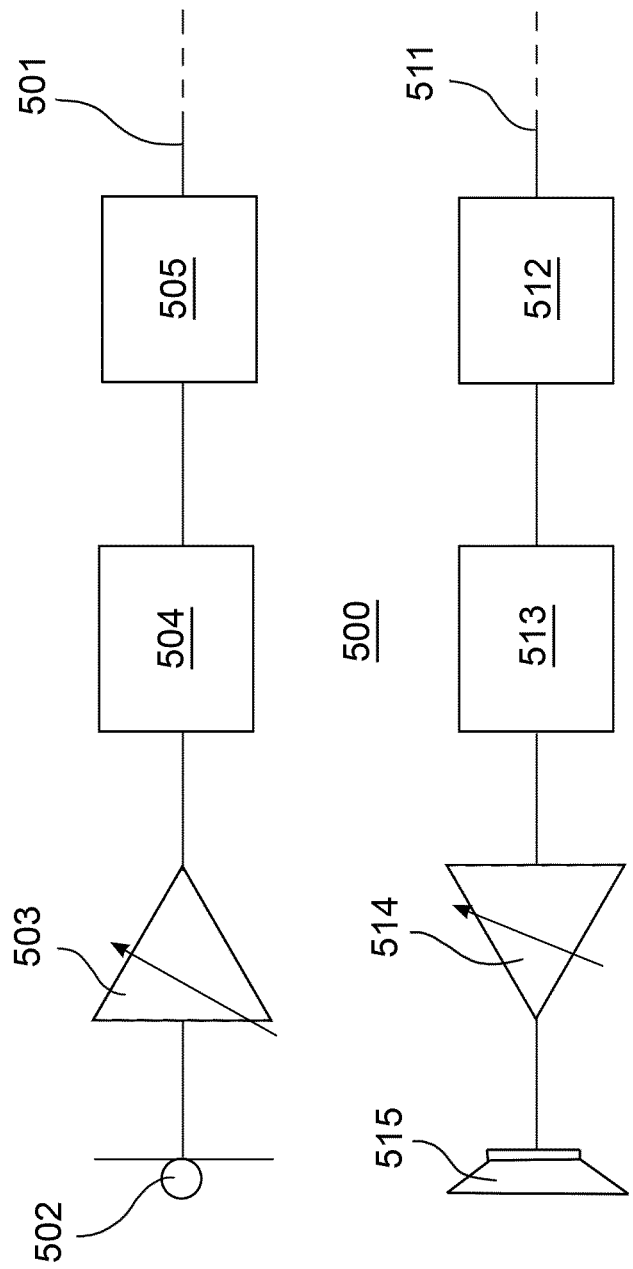
FIG. 5 shows a block diagram of an electronic apparatus employing the two-stage operational amplifier in class AB according to the invention.

With reference now to FIG. 5, an example of electronic equipment (i.e. a digital audio device) employing the operational amplifier according to the invention is briefly described.

The electronic equipment 500 is for example a mobile telephone. Such electronic equipment 500 comprises a digital audio recorder device or chain 501 and a digital audio player device or chain 511. The other electronic components of the electronic equipment 500 operatively connected to both the audio chains, are not illustrated in the FIG. 5.

The digital audio recorder device 501 comprises a microphone 502.

Such digital audio recorder device 501 further comprises a microphone pre-amplifier 503.

In addition, the digital audio recorder device or simply digital audio device 501 further comprises an Analog-to-Digital Converter (ADC) 504.

Moreover, the digital audio recorder device 501 further comprises a digital filter 505.

It should be observed that the Analog-to-Digital Converter 504 comprises an operational amplifier in class AB of the type described above with reference to the embodiment of the invention (FIG. 4).

The digital audio player device 511 comprises a further digital filter 512, a Digital-to-Analog Converter (DAC) 513, a transducer amplifier 514 and a speaker 515.

The invention claimed is:

1. Two-stage operational amplifier in class AB for driving a load comprising:
an input stage comprising differential input terminals and a first differential output terminal and a second differential output terminal for providing a first differential driving signal and a second differential driving signal, respectively;
an output stage comprising a first output branch having a first differential input terminal operatively connected to the first differential output terminal of the input stage to receive the first differential driving signal and a second output branch having a second differential input terminal operatively connected to the second differential output terminal of the output stage to receive the second differential driving signal,
a control circuit configured to control the output current on the first output branch and the second output branch of the output stage, the control circuit comprising a first PMOS transistor in a diode configuration and operatively connected in a current mirror configuration to a second PMOS transistor of the first output branch of the output stage, a first NMOS transistor connected in series with the first PMOS transistor and having a gate terminal connected to a bias voltage, a third PMOS transistor in a diode configuration and operatively connected in a current mirror configuration to a fourth PMOS transistor of the second output branch of the output stage, a second NMOS transistor connected in series with the third PMOS transistor and having a gate terminal connected to the bias voltage,
wherein the control circuit further comprises:
a third NMOS transistor operatively connected in parallel with the first NMOS transistor and having a gate terminal arranged to receive the second differential driving signal, and
a fourth NMOS transistor operatively connected in parallel with the second NMOS transistor and having a gate terminal arranged to receive the first differential driving signal.

2. The operational amplifier of claim 1, wherein the first PMOS transistor has a source terminal connected to a first reference voltage and a drain terminal connected to both a drain terminal of the first NMOS transistor and a drain terminal of the third NMOS transistor, both the first NMOS transistor and the third NMOS transistor ($M_{N3B}$) having source terminals connected to a second reference voltage.

3. The operational amplifier of claim 1, wherein the third PMOS transistor has a source terminal connected to the first reference voltage and a drain terminal connected to both a drain terminal of the second NMOS transistor and a drain terminal of the fourth NMOS transistor, both the second NMOS transistor and the fourth NMOS transistor having source terminals connected to the second reference voltage.

4. The operational amplifier claim 1, wherein the first output branch comprising the second PMOS transistor and a fifth NMOS transistor connected in series one another between the first reference voltage and the second reference voltage, the second PMOS transistor of the first output branch being connected in a current mirror configuration with the first PMOS transistor of the control circuit.

5. The operational amplifier claim 1, wherein the second output branch comprising a fourth PMOS transistor and a sixth NMOS transistor connected in series one another between the first reference voltage and the second reference voltage, the fourth PMOS transistor of the first output branch being connected in a current mirror configuration with the third PMOS transistor of the control circuit.

6. An Analog-to-Digital Converter comprising a two-stage class AB operational amplifier in accordance with claim 1.

7. A portable equipment (500) comprises:
an Analog-to-Digital Converter according to claim 6;
a digital filter.

* * * * *